United States Patent [19]

Koze

[11] Patent Number: 4,687,682

[45] Date of Patent: Aug. 18, 1987

[54] BACK SEALING OF SILICON WAFERS

[75] Inventor: Jeffrey T. Koze, Whitehall, Pa.

[73] Assignee: American Telephone and Telegraph Company, AT&T Technologies, Inc., Berkeley Heights, N.J.

[21] Appl. No.: 858,688

[22] Filed: May 2, 1986

[51] Int. Cl.[4] .......................................... H01L 21/318
[52] U.S.Cl. ............................ 437/238; 148/DIG. 7; 148/DIG. 15; 148/DIG. 60; 437/241
[58] Field of Search ............. 427/94, 95; 148/DIG. 7, 148/DIG. 15, DIG. 60

[56] References Cited

U.S. PATENT DOCUMENTS

| | | | |
|---|---|---|---|
| 3,556,841 | 1/1971 | Iwasa | 427/95 |
| 3,660,180 | 5/1972 | Wajda | |
| 3,663,319 | 5/1972 | Rose | |
| 3,669,769 | 6/1972 | Badami et al. | |
| 3,716,422 | 2/1973 | Ing et al. | |
| 3,765,960 | 10/1973 | Boss et al. | |
| 3,769,104 | 10/1973 | Ono et al. | |
| 3,934,060 | 1/1976 | Burt | 427/95 |
| 4,438,157 | 3/1984 | Romano-Moran | 427/94 |

FOREIGN PATENT DOCUMENTS 60-211846  10/1985  Japan ..................... 427/95

OTHER PUBLICATIONS

Bratter et al., "Dielectric Structure as an Out-Diffusion Barrier" IBM TDB vol.-No. 6, Nov. 1970, p. 1422.
Annual Review of Materials Science, vol. 12, 1982, Robert A. Huggins, Editor-"Low Pressure Chemical Vapor *Vapor Deposition*"-S. D. Hersee and J. P. Duchemin, pp. 65 through 80.
Journal of Crystal Growth 70(1984) pp. 602 through 608, "*The Role of Oxygen in Silicon for VLSI*", K. Benzon & W. Lin.
Journal of Crystal Growth 70(1984), pp. 230 through 252, "*Reduced Pressure Silicon Epitaxy: A Review*"-C. W. Cullen & J. F. Corboy.

Primary Examiner—John D. Smith
Attorney, Agent, or Firm—James H. Fox

[57] ABSTRACT

Sealing the backside of a semiconductor wafer prevents evaporation of the dopant (typically boron) when an epitaxial layer is grown on the front (active) side, thereby preventing autodoping of the epitaxial layer with excess dopant. The present technique deposits an oxide layer during the ramp-up of the furnace that also deposits the nitride cap, thereby avoiding an extra process step. It also avoids the higher temperatures required for the prior-art technique of growing the oxide layer, resulting in lower oxygen precipitation due to the capping process and a greater yield of usable wafers.

14 Claims, 2 Drawing Figures

4,687,682

BACK SEALING OF SILICON WAFERS

BACKGROUND OF THE INVENTION

The present invention relates to the production of semiconductor devices. In particular, it concerns an improved technique for sealing the back side of a silicon wafer prior to growing an epitaxial layer on the opposite (front) side, typically for the production of integrated circuits.

DESCRIPTION OF THE PRIOR ART

In the production of integrated circuits and other semiconductor devices, an epitaxial layer on a silicon wafer is frequently used for the formation of the device structures in whole or in part. This allows, for example, a difference in the doping for the epitaxial layer as compared to the silicon wafer (substrate) on which it is formed. In order to form an epitaxial layer on a silicon wafer, the wafer is typically subjected to a high temperature while a carrier gas comprising the desired epitaxial material is flowed across the wafer, resulting in the chemical vapor deposition (CVD) of the desired material onto the wafer.

The high temperatures used in the epitaxial process tend to cause dopants present in the wafer to diffuse out of the back side of the wafer and into the surrounding vapor, and from there into the epitaxial layer being formed on the front side. This "autodoping", as it is referred to in the art, then changes the doping level in the epitaxial layer from its desired value. This is especially of concern when the desired doping in the epitaxial layer is much less than that of the wafer. For example, for the production of dynamic random access memories, a lightly doped p-type epitaxial layer is frequently formed on a more heavily doped p-type wafer. If an excessive amount of p-dopant transfers to the epitaxial layer by autodoping, then its doping level will exceed the desired level. In one typical process, the doping of the wafer is at least $10^{18}$ atoms of boron per cubic centimeter, and the doping of the epitaxial layer is less than $10^{16}$ boron atoms per cubic centimeter; see U.S. Pat. No. 4,216,489 co-assigned herewith.

To reduce autodoping, it is known in the art to grow a "cap" on the backside of the wafer prior to the epitaxial deposition process. The cap is one or more layers that are relatively impervious to the dopant in the wafer. The outdiffusion of the dopant from the wafer is thereby reduced. For capping a silicon wafer, the prior art technique typically calls for first thermally growing an oxide layer on the back side of the wafer by furnace heating the wafer to a high temperature, typically about 1050 degrees C., in an oxygen ambient. The wafer is then transported to a separate low pressure chemical vapor deposition (LPCVD) furnace for deposition of the silicon nitride cap at a lower temperature than that used for the oxide growth. The silicon nitride layer, being relatively impervious to the commonly used dopants, provides most of the protection against dopant outgassing. The silicon dioxide layer is included mainly to provide strain relief between the silicon wafer and the nitride cap, and to facilitate subsequent removal of the nitride cap after the epitaxial process is completed.

It is very important that the resulting structure be of high crystallographic quality. That is, the epitaxial deposition process should continue the single crystal structure of the wafer without introducing additional faults into either the wafer or the epitaxial layer. Hence, the capping process itself should not promote any mechanism that will have a significant adverse effect on crystal quality, either during the epitaxial layer formation, or during subsequent device processing steps. One known factor affecting quality is the presence of oxygen in the crystal. It is generally desirable to have some oxygen present in the silicon wafer, in order to "getter" defects before they propagate to the active surface of the wafer. For example, an oxygen concentration of at least 10 parts per million is presently desirable. On the other hand, oxygen itself can produce defects, particularly if it precipitates out of the crystal lattice prior to polishing the front side of the wafer. However, after polishing, some precipitation is desirable to promote the gettering. Such precipitation may occur due to the high temperature and long time required for the epitaxial deposition process, or during subsequent process heating steps.

The amount of oxygen typically varies as a function of position in the silicon ingot from which the wafers are cut. The top portion of the ingot typically contains the highest oxygen concentration, when grown by the Czochralski technique. For the production of integrated circuit dynamic memories, it is known in some cases to use only the bottom half of the ingot for wafers on which epitaxial layers are to be formed, in order to reduce the oxygen precipitation problem. This requires sorting the wafers into groups, and adds extra costs to the production process. It also reduces the number of available wafers for use in the epitaxial process for a given number of silicon ingots grown.

SUMMARY OF THE INVENTION

I have invented an improved technique for capping a silicon wafer wherein a layer of silicon dioxide is deposited at a relatively low temperature on the back side of the wafer during the ramp-up in temperature of a LPCVD furnace. A layer of silicon nitride is then deposited on the silicon dioxide at the elevated temperature resulting from the ramp-up. The deposition of the silicon dioxide is typically accomplished by low pressure chemical vapor deposition using tetraethylorthosilicate (TEOS).

DETAILED DESCRIPTION

The following detailed description relates to an improved method for capping silicon wafers to prevent autodoping during a subsequent epitaxial growth process. The improved technique provides for reduced oxygen precipitation, while shortening the time required for the capping process. This is achieved by making use of the ramp-up period of the furnace used for subsequent silicon nitride deposition. The temperature during this period is less than that used in prior-art capping processes. According to known principles, the amount of oxygen precipitation is reduced according to the reduction of the time-temperature product to which the silicon wafer is subjected. Hence, a time period otherwise not used for this purpose provides a useful environment for forming the silicon dioxide cap layer.

Figure 1:
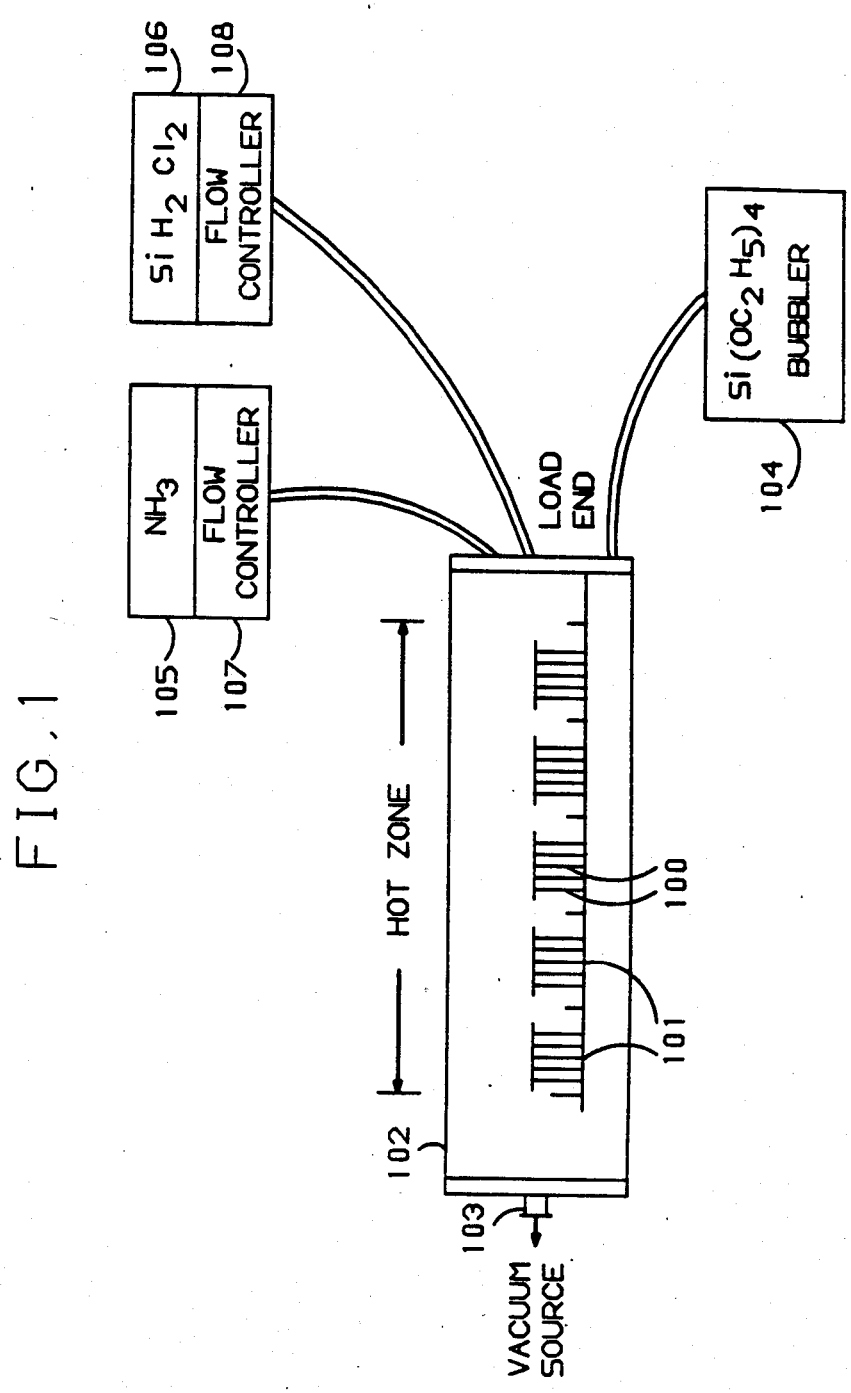
FIG. 1 shows a furnace system suitable for use with the present invention.

Referring to FIG. 1, silicon wafers (100) are placed by pairs into wafer boats (101), so that the active face of one wafer contacts the active face of another. This helps ensure that the subsequently formed cap will not form on the active side of each wafer, but only on the exposed (back) side. The wafer boats are then covered to increase the uniformity of the deposits.

The boats are loaded into the furnace (102), which may be of a conventional quartz tube type, so as to reside in the "hot zone". A vacuum is applied to a vacuum inlet (103). The TEOS used for the oxide deposition is supplied to the furnace from a bubbler (104). The nitrogen and silicon used for the nitride deposition are supplied from a source (105) of ammonia ($NH_3$) and a source (106) of dichlorosilane ($SiH_2Cl_2$), with other source gasses being possible. The flow of the source gasses into the furnace is regulated by mass flow controllers (107, 108).

Figure 2:
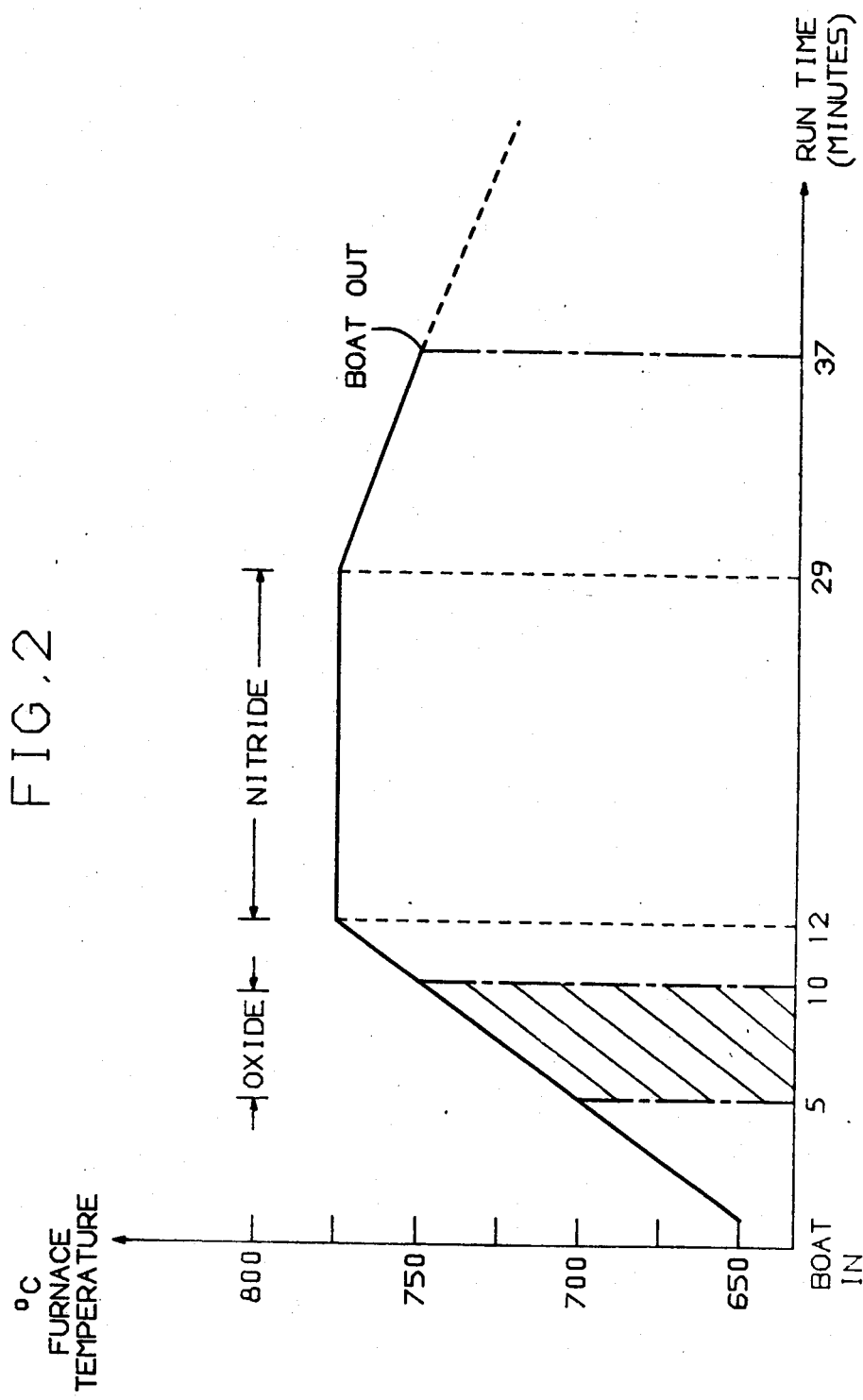
FIG. 2 shows a typical temperature profile used in practicing the present invention.

Referring to FIG. 2, the temperature of the furnace is ramped up from the idling temperature of about 650 degrees C. while the vacuum source pumps down the pressure to about 20 to 30 millitorr base pressure. After about 5 minutes into the ramp-up, the TEOS is introduced into the furnace, while continuing to apply a vacuum. The flow of the TEOS produces a desired pressure of about 250 to 300 millitor, resulting in a deposition of $SiO_2$ at a rate of about 50 angstroms (5 nanometers) per minute. The TEOS flow continues for about 5 minutes, resulting in a total deposit of about 250 angstroms (25 nanometers) of $SiO_2$. After the termination of the TEOS flow about 10 minutes into the ramp-up, the temperature continues to increase to about 775 degrees C.

At about 12 minutes into the cycle, the $NH_3$ is introduced into the furnace at a flow rate of about 300 cubic centimeters per minute, and the $SiH_2Cl_2$ is introduced at a flow rate of about 30 cubic centimeters per minute. This results in a deposition of the silicon nitride cap layer at a rate of about 29 angstroms (2.9 nanometers) per minute. The pressure during this deposition is about 290 millitorr. This deposition continues for about 17 minutes, resulting in a silicon nitride cap about 500 angstroms (50 nanometers) thick. The flow of the source gasses is then stopped, and the furnace pumped down to the base pressure to clean the furnace tube. The flow controllers for the source gasses are purged by a flow of $N_2$, while the temperature is ramped down to the idling value. The furnace is filled with $N_2$ gas at atmospheric pressure, and the wafer boats removed from the furnace.

Following the present capping technique, the front side of the wafers are polished to provide a highly specular, damage-free surface. This is typically accomplished by polishing the front side of the wafer using a caustic slurry as a polishing agent. They are then ready for the epitaxial growth process according to procedures known in the art. Although silicon, including dopants as desired, is typically grown as the epitaxial layer, other materials are possible. For example, the epitaxial growth of germanium and/or group III-V semiconductor materials on silicon wafers is being explored by workers in the art, and can benefit from the use of silicon wafers capped according to the present technique. A review of some current epitaxial techniques is given in "Low-Pressure Chemical Vapor Deposition", S. D. Hersee et al, *Annual Review of Materials Science* Vol. 12, pp. 65–80 (1982). The resulting wafers may then be used for integrated circuit production, or for the production of various other semiconductor devices.

What is claimed is:

1. A method of making a solid state device by steps comprising capping a back side of a semiconductor wafer in preparation for forming an epitaxial layer of a semiconductor material on the front side of said wafer, characterized in that said capping is accomplished by steps comprising:

introducing said wafer into a furnace;

increasing the temperature in said furnace while introducing a source gas comprising a silicon compound and a source of oxygen into said furnace, thereby depositing silicon dioxide onto said wafer during said increasing the temperature;

maintaining said furnace at an elevated temperature and introducing a source of silicon and a source of nitrogen into said furnace, thereby depositing silicon nitride onto said silicon dioxide;

and removing said wafer from said furnace.

2. The method of claim 1 wherein said source gas comprising a silicon compound and said source of oxygen is tetraethylorthosilicate.

3. The method of claim 1 wherein said source gas comprising a silicon compound is dichlorosilane.

4. The method of claim 1 wherein said source of nitrogen is ammonia.

5. The method of claim 1 wherein said depositing silicon dioxide is substantially accomplished at a temperature below 775 degrees C.

6. The method of claim 1 wherein said depositing silicon dioxide is accomplished during a time period of less than 10 minutes.

7. The method of claim 1 further comprising the step of polishing the front side of said wafer following said removing said wafer from said furnace and prior to said forming an epitaxial layer.

8. The method of claim 7 wherein said polishing is accomplished with a caustic slurry.

9. The method of claim 1 wherein said wafer as introduced into said furnace has a concentration of unprecipitated oxygen of at least 10 parts per million.

10. The method of claim 9 wherein the concentration of unprecipitated oxygen in said wafer is substantially unchanged during said depositing silicon dioxide.

11. The method of claim 1 wherein said wafer as introduced into said furnace has a doping level of at least $10^{18}$ atoms per cubic centimeter.

12. The method of claim 11 wherein the dopant that produces said doping level is boron.

13. The method of claim 1 further comprising the step of precipitating a substantial amount of unprecipitated oxygen in said wafer so as to getter impurities following said removing said wafer from said furnace.

14. The method of claim 1 wherein said semiconductor wafer is a silicon wafer.

* * * * *